US008818764B2

(12) United States Patent
Kishi et al.

(10) Patent No.: US 8,818,764 B2

(45) Date of Patent: Aug. 26, 2014

(54) DOWNMIXING DEVICE AND METHOD

(75) Inventors: Yohei Kishi, Kawasaki (JP); Masanao Suzuki, Kawasaki (JP); Miyuki Shirakawa, Fukuoka (JP); Yoshiteru Tsuchinaga, Fukuoka (JP)

(73) Assignee: Fujitsu Limited, Kawasaki-shi (JP)

( * ) Notice: Subject to any disclaimer, the term of this patent is extended or adjusted under 35 U.S.C. 154(b) by 247 days.

(21) Appl. No.: 13/074,379

(22) Filed: Mar. 29, 2011

(65) Prior Publication Data

US 2011/0246139 A1 Oct. 6, 2011

(30) Foreign Application Priority Data

Mar. 30, 2010 (JP) .................................. 2010-78570

(51) Int. Cl.
*H03F 1/26* (2006.01)

(52) U.S. Cl.
USPC .............................. 702/196; 702/189; 381/20

(58) Field of Classification Search
USPC ................................ 702/189; 381/22, 23, 20
See application file for complete search history.

(56) References Cited

U.S. PATENT DOCUMENTS

| | | | | |
|---|---|---|---|---|
| 7,734,053 | B2 | 6/2010 | Suzuki et al. | |
| 2007/0002971 | A1* | 1/2007 | Purnhagen et al. | 375/316 |
| 2007/0019813 | A1* | 1/2007 | Hilpert et al. | 381/22 |
| 2007/0194952 | A1* | 8/2007 | Breebaart et al. | 341/50 |
| 2007/0239442 | A1* | 10/2007 | Hotho et al. | 704/226 |
| 2007/0280485 | A1* | 12/2007 | Villemoes | 381/22 |
| 2008/0205676 | A1* | 8/2008 | Merimaa et al. | 381/310 |
| 2009/0003612 | A1* | 1/2009 | Herre et al. | 381/17 |
| 2011/0022402 | A1* | 1/2011 | Engdegard et al. | 704/501 |

FOREIGN PATENT DOCUMENTS

| | | |
|---|---|---|
| JP | 2007-183528 | 7/2007 |
| JP | 2008-517337 | 5/2008 |
| JP | 2008-536184 | 9/2008 |
| WO | WO-2006/048203 | 5/2006 |
| WO | WO-2006/108573 | 10/2006 |

* cited by examiner

*Primary Examiner* — John Breene
*Assistant Examiner* — Stephanie Bloss
(74) *Attorney, Agent, or Firm* — Oblon, Spivak, McClelland, Maier & Neustadt, L.L.P.

(57) ABSTRACT

A downmixing device includes: a matrix conversion unit configured to perform a matrix operation for an input signal; a rotation correction unit configured to rotate an output signal of the matrix conversion unit; a spatial information extraction unit configured to extract spatial information from the output signal of the rotation correction unit; and an error calculation unit configured to calculate an error amount of the matrix operation result for the input signal by performing a matrix operation for the output signal of the rotation correction unit and the spatial information extracted by the spatial information extraction unit using a matrix that is inverse to the matrix used for the matrix operation by the matrix conversion unit.

9 Claims, 7 Drawing Sheets

DOWNMIXING DEVICE AND METHOD

CROSS-REFERENCE TO RELATED APPLICATIONS

This application is based upon and claims the benefit of priority of the prior Japanese Patent Application No. 2010-78570, filed on Mar. 30, 2010, the entire contents of which are incorporated herein by reference.

FIELD

The embodiments discussed herein relate to a downmixing device and a downmixing method.

BACKGROUND

Conventionally, downmix technologies are known that convert an audio signal of a plurality of channels into an audio signal of the fewer number of channels. As one of the downmix technologies, there is a predictive downmix technology. As one encoding method that uses the predictive downmix technology, there is a Moving Picture Experts Group (MPEG) surround method of International Organization for Standardization (ISO)/International Electrotechnical Commission (IEC). In the MPEG surround method, two stages of downmixing processing are performed when an input signal of six channels that is generally called 5.1 channels is downmixed to two channel signals.

For example, among six-channel signals, two-channel signals are downmixed to a one-channel signal respectively to obtain three channel signals in the first stage of downmixing processing. In the second stage of the downmixing processing, a matrix conversion, for example, by the following expression (1) is applied, for example, to the signal of three channels, $L_{in}$, $R_{in}$, and $C_{in}$ that are obtained in the first stage of the downmixing processing. In the expression (1), D indicates a downmix matrix, and represented, for example, by the second expression (2).

Expression 1

$$\begin{bmatrix} l_0 \\ r_0 \\ \hat{c}_0 \end{bmatrix} = D \begin{bmatrix} L_{in} \\ R_{in} \\ C_{in} \end{bmatrix} \tag{1}$$

Expression 2

$$D = \begin{bmatrix} 1 & 0 & \frac{1}{2}\sqrt{2} \\ 0 & 1 & \frac{1}{2}\sqrt{2} \\ 1 & 1 & -\frac{1}{2}\sqrt{2} \end{bmatrix} \tag{2}$$

The vector $c\hat{}_0$ obtained by the expression (1) is decomposed into a linear sum of two vectors, $l_0$ and $r_0$ as represented by the following expression (3). In the present disclosure, $c\hat{}$ indicates that "ˆ" is placed over the "c." In the expression (3), $k_1$ and $k_2$ are coefficients. The predicted signal $c_0$ is represented by the expression (4), when Channel Prediction Coefficients (CPC) that are substantially the closest to the $k_1$ is $c_1$ and $k_2$ is $c_2$.

Expression 3

$$\hat{c}_0 = k_1 \times l_0 + k_2 \times r_0 \tag{3}$$

Expression 4

$$c_0 = c_1 \times l_0 + c_2 \times r_0 \tag{4}$$

Japanese Laid-open Patent Publication No. 2008-517337 (WO2006/048203: May 11, 2006) discusses a downmix technology in which a scaling correction is applied to a downmix signal based on an energy difference between an input signal and an upmix signal to compensate an energy loss caused when a signal of a plurality of channels are generated from the downmix signal. Moreover, Japanese Laid-open Patent Publication No. 2008-536184 (WO2006/108573: Oct. 19, 2006) discusses an encoding technology in which a rotation matrix inverse to a rotation matrix to be used for upmixing processing is applied to left and right channel signals beforehand when executing downmixing processing in order to apply the rotation matrix to be used for upmixing processing to the downmix signal and the residual signal when executing upmixing processing.

SUMMARY

A downmixing device includes: a matrix conversion unit configured to perform a matrix operation for an input signal; a rotation correction unit configured to rotate an output signal of the matrix conversion unit; a spatial information extraction unit configured to extract spatial information from the output signal of the rotation correction unit; and an error calculation unit configured to calculate an error amount of the matrix operation result for the input signal by performing a matrix operation for the output signal of the rotation correction unit and the spatial information extracted by the spatial information extraction unit using a matrix that is inverse to the matrix used for the matrix operation by the matrix conversion unit, wherein the rotation correction unit determines a final rotation result based on the error amount calculated by the error calculation unit; and the spatial information extraction unit determines final spatial information based on the error amount calculated by the error calculation unit.

The object and advantages of the invention will be realized and attained by at least the features, elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, issues related to the present disclosure will be pointed out, and embodiments of the present disclosure will be described.

In the above-described background, when vectors of input signals $L_{in}$ and $R_{in}$ are substantially the same, vectors of $l_0$ and $r_0$ obtained by a matrix conversion become substantially the same (refer to expressions 1 and 2). In this case, the vector $\hat{c}_0$ may not be completely reproduced by a linear sum of the two vectors $l_0$ and $r_0$, (refer to the expression (3)) and a phase of a predicted signal $c_0$ becomes the same phase as the phases of the $l_0$ and $r_0$.

At a decoder side, for example, an output signal of the three channels, $L_{out}$, $R_{out}$, and $C_{out}$ are generated by applying an inverse matrix conversion to the $l_0$, $r_0$, $c_1$ and $c_2$ in the upmixing processing. At that time, when phases of the $l_0$, $r_0$, and $c_0$ are substantially the same, phases of the output signals of $L_{out}$, $R_{out}$, and $C_{out}$ become substantially the same phases as well. Thus, the original input signals of $L_{in}$, $R_{in}$, and $C_{in}$ at the encoder side may not be reproduced at the decoder side with high accuracy. In other words, there is a disadvantage in that sound quality is degraded through the matrix conversion in the downmixing processing and the inverse matrix conversion in the upmixing processing.

Hereinafter, embodiments of the downmixing device and the downmixing method will be described in detail by referring to the accompanying drawings. The downmixing device and the downmixing method suppress degradation of sound reproduced at a decoder side by applying a rotation correction to a downmix signal obtained from an input signal based on an error amount of an upmix signal obtained from the downmix signal for the input signal.

First Embodiment

Description of a Downmixing Device

Figure 1:
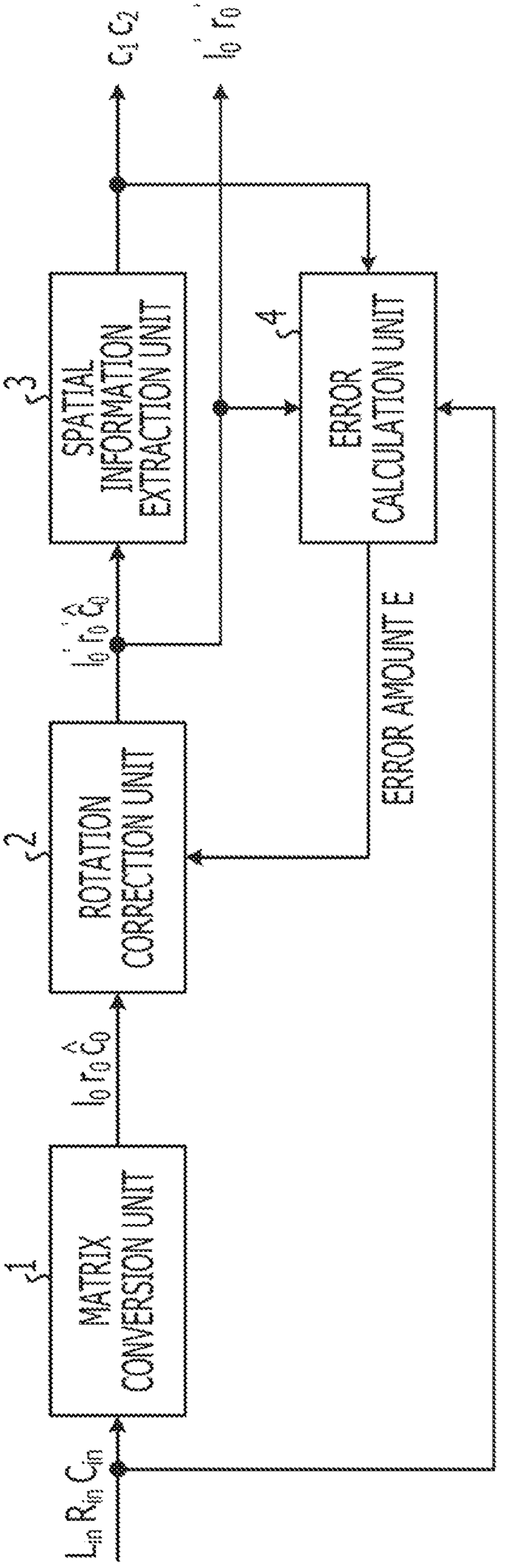
FIG. 1 is a block diagram illustrating a downmixing device according to a first embodiment.

FIG. 1 is a block diagram illustrating a downmixing device according to the first embodiment. As illustrated in FIG. 1, the downmixing device includes a matrix conversion unit 1, a rotation correction unit 2, a spatial information extraction unit 3, and an error calculation unit 4. The matrix conversion unit 1 performs a matrix operation for input signals, $L_{in}$, $R_{in}$, and $C_{in}$. The matrix conversion unit 1 may perform a matrix operation indicated by the above-described expressions (1) and (2). According to the matrix operation, vectors of the two channels, $l_0$ and $r_0$, and a vector of a signal to be predicted $\hat{c}_0$ are obtained.

The rotation correction unit 2 performs a rotation operation for the $l_0$ and $r_0$ that are output from the matrix conversion unit 1. The rotation correction unit 2 may perform a matrix operation indicated by the following expressions (5) and (6). In the expression (5), $\theta_l$ is a rotation angle of $l_0$, while $\theta_r$ is a rotation angle of $r_0$. Vectors $l_0'$ and $r_0'$ are obtained by rotating the vectors of the two channels, $l_0$ and $r_0$ through the matrix operation. The rotation correction unit 2 may perform a rotation operation for the $l_0$ and $r_0$ typically when vectors of the $l_0$ and $r_0$ are substantially the same.

Expression 5

$$\begin{bmatrix} l_0' \\ r_0' \end{bmatrix} = \begin{bmatrix} e^{i\theta_l} & 0 \\ 0 & e^{i\theta_r} \end{bmatrix} \begin{bmatrix} l_0 \\ r_0 \end{bmatrix} \tag{5}$$

Expression 6

$$e^{i\theta} = \cos\theta + i \cdot \sin\theta \tag{6}$$

The rotation correction unit 2 determines $l_0'$ and $r_0'$ that become a final rotation result based on an error amount E calculated by the error calculation unit 4. For example, the rotation correction unit 2 may determine $l_0'$ and $r_0'$ when the error amount E is substantially the minimum as a final rotation result. The $l_0'$ and $r_0'$ that are determined as the final rotation result becomes a part of an output signal of the downmixing device illustrated in FIG. 1.

The spatial information extraction unit 3 extracts spatial information based on the output signals, $l_0'$ and $r_0'$ of the rotation correction unit 2. The spatial information extraction unit 3 may decompose the vector to be predicted $\hat{c}_0$ obtained by the matrix conversion unit 1 into a linear sum of two vectors $l_0'$ and $r_0'$. The spatial information extraction unit 3 may obtain channel predictive parameters $c_1$ and $c_2$ as spatial information that are substantially closest to the coefficient $k_1$ of the $l_0'$ and the coefficient $k_2$ of $r_0'$. The channel predictive parameters $c_1$ and $c_2$ may be provided by a table. A vector $c_0'$ of a predictive signal may be obtained by the expression (7) below by using two vectors $l_0'$ and $r_0'$ corrected by the rotation correction unit 2 and the channel predictive parameters $c_1$ and $c_2$.

Expression 7

$$c_0' = c_1 \times l_0' + c_2 \times r_0' \tag{7}$$

The spatial information extraction unit 3 determines channel predictive parameters, $c_1$ and $c_2$ that become final spatial information based on an error amount E calculated by the error calculation unit 4. For example, the spatial information extraction unit 3 may determine $c_1$ and $c_2$ when the error amount E is substantially the minimum as final spatial information. The $c_1$ and $c_2$ that are determined as the final spatial information become a part of an output signal of the downmixing device illustrated in FIG. 1.

The error calculation unit 4 performs a matrix operation for the $l_0'$ and $r_0'$ that are corrected by the rotation correction unit 2 and the $c_1$ and $c_2$ that are extracted by the spatial information extraction unit 3. The error calculation unit 4 may perform a matrix operation by using an inverse matrix of the matrix, for example, used in the matrix operation by the matrix conversion unit 1. In other words, the error calculation unit 4 may perform a matrix operation represented, for example, by the expressions (8) and (9). In the expression (8), the $D^{-1}$ is, for example, an inverse matrix of the downmix matrix represented by the above-described expression (2). The $c_0'$ is obtained by the expression (7). Through the matrix operation, upmix vectors of three channels, $L_{out}$, $R_{out}$, and $C_{out}$ are obtained.

Expression 8

$$\begin{bmatrix} L_{out} \\ R_{out} \\ C_{out} \end{bmatrix} = D^{-1} \begin{bmatrix} l_0' \\ r_0' \\ c_0' \end{bmatrix} \tag{8}$$

Expression 9

$$D^{-1} = \frac{1}{3} \begin{bmatrix} 2 & -1 & 1 \\ -1 & 2 & 1 \\ \sqrt{2} & \sqrt{2} & -\sqrt{2} \end{bmatrix} \tag{9}$$

The error calculation unit 4 calculates error amounts of the $L_{out}$, $R_{out}$, and $C_{out}$ for the input signals, $L_{in}$, $R_{in}$, and $C_{in}$. The $L_{out}$, $R_{out}$, and $C_{out}$ are upmix signals for the input signals $L_{in}$, $R_{in}$, and $C_{in}$. The error calculation unit 4 may calculate error power between the input signals and upmix signals for each of the three channels respectively as an error amount E, for example, as represented in the expression (10).

Expression 10

$$E=|L_{out}-L_{in}|^2+|R_{out}-R_{in}|^2+|C_{out}-C_{in}|^2 \quad (10)$$

Description of the Downmixing Method

Figure 2:
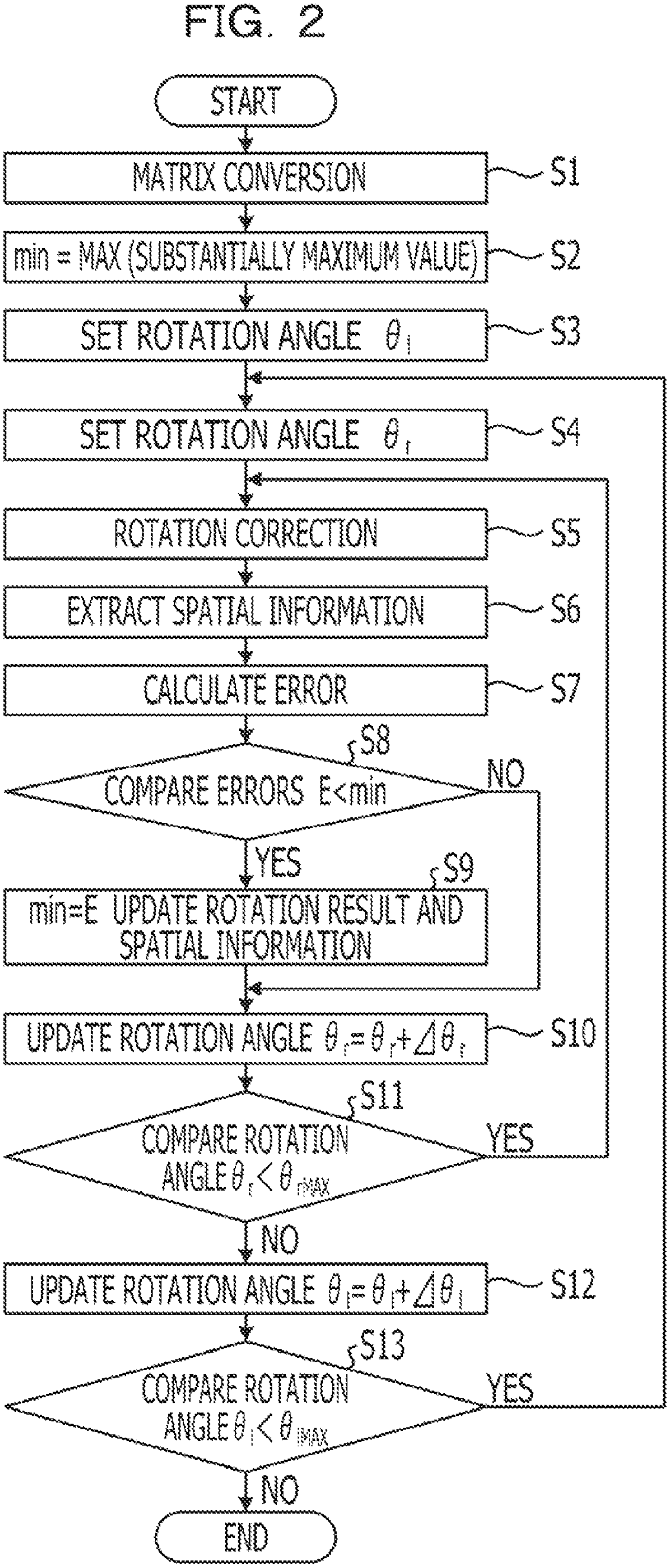
FIG. 2 is a flow chart illustrating a down mixing method according to the first embodiment.

FIG. 2 is a flow chart illustrating a downmixing method according to the first embodiment. As illustrated in FIG. 2, when the downmixing processing starts, the matrix conversion unit 1 performs a matrix operation for the input signals $L_{in}$, $R_{in}$, and $C_{in}$ (Operation S1). Through the matrix operation, $l_0$, $r_0$, and $\hat{c}_0$ are obtained. Processing described below may be performed typically when vectors of the $l_0$ and $r_0$ are the same.

A variable "min" is provided and is set to MAX (substantially the maximum value) by the rotation correction unit 2 (Operation S2). The MAX (substantially the maximum value) is provided as an initial value for the variable "min." The variable "min" is retained, for example, in a buffer. A rotation angle $\theta_l$ of the $l_0$ is set as an initial value by the rotation correction unit 2 (Operation S3). A rotation angle $\theta_r$ of the $r_0$ is set as an initial value by the rotation correction unit 2 (Operation S4). For example, initial values for the $\theta_l$ and the $\theta_r$ may be 0. The rotation correction unit 2 rotates the $l_0$ and $r_0$ by the set angles (Operation S5). As a result of the rotations, corrected vectors, $l_0'$ and $r_0'$ are obtained.

The spatial information extraction unit 3 extracts spatial information based on the $l_0'$ and $r_0'$ (Operation S6). Accordingly, channel predictive parameters, $c_1$ and $c_2$ are obtained by extracting the spatial information.

The error calculation unit 4 calculates $c_0'$ by using the $l_0'$, $r_0'$, $c_1$, and $c_2$. A matrix operation that is inverse to the matrix operation in the Operation S1 is applied to the $c_0'$, $l_0'$, and $r_0'$. Upmix signals $L_{out}$, $R_{out}$, and $C_{out}$ are obtained by the matrix operation. The error calculation unit 4 calculates an error amount E of upmix signals $L_{out}$, $R_{out}$, and $C_{out}$ for the input signals $L_{in}$, $R_{in}$, and $C_{in}$ (Operation S7).

The error calculation unit 4 compares the error amount E obtained at Operation S7 with the variable min (Operation S8). When the error amount E is smaller than the variable min (Operation S8: Yes), the variable min is updated to the error amount E obtained at Operation S7. Moreover, the $l_{0'}$ and $r_{0'}$, obtained at Operation S5 and the $c_1$ and $c_2$ obtained at Operation S6 are retained, for example, in a buffer (Operation S9). When the error amount E is not smaller than the variable min (Operation S8: No), the variable min is not updated. Moreover, the $l_0'$, $r_0'$, $c_1$, and, $c_2$ may be or may not be retained (Operation S9).

The rotation correction unit 2 adds a $\Delta\theta_r$ to the rotation angle $\theta_r$ and updates the rotation angle $\theta_r$. The $\theta_r$ may be, for example, $\pi/180$ (Operation S10). The updated rotation angle $\theta_r$ is compared with a rotation end angle $\theta_{rMAX}$ (Operation S11). The rotation end angle $\theta_{lMAX}$ may be $2\pi$. When the rotation angle $\theta_r$ is smaller than the rotation end angle $\theta_{rMAX}$ (Operation S11: Yes), Operations S5 to S10 are repeated. When the updated rotation angle $\theta_r$ is not smaller than the rotation end angle $\theta_{rMAX}$ (Operation S11: No), Operations S5 to S10 are not repeated. The rotation correction unit 2 adds a $\Delta\theta_l$ to the rotation angle $\theta_l$ and updates the rotation angle $\theta_l$. The $\theta_l$ may be, for example, $\pi/180$ (Operation S12). The updated rotation angle $\theta_l$ is compared with a rotation end angle $\theta_{lMAX}$ (Operation S13). The rotation end angle $\theta_{lMAX}$ may be $2\pi$. When the rotation angle $\theta_l$ is smaller than the rotation end angle $\theta_{lMAX}$ (Operation S13: Yes), Operations S4 to S12 are repeated. When the rotation angle $\theta_l$ is not smaller than the rotation end angle $\theta_{lMAX}$ (Operation S13: No), Operations S4 to S12 are not repeated.

When processing from Operations S3 to S13 are completed for all of the rotation angles $\theta_l$ and $\theta_r$ in a range that is set, the series of the downmixing processing is completed. At this time, the $l_0'$, $r_0'$, $c_1$, and, $c_2$ when the error amount is substantially the minimum are retained, for example, in a buffer. In other words, the $l_0'$, $r_0'$, $c_1$, and, $c_2$ when the error amount is substantially the minimum are obtained. The downmixing device outputs the $l_0'$, $r_0'$, $c_1$, and, $c_2$ when the error amount is substantially the minimum.

Comparison of Error Amounts E

Figure 3:
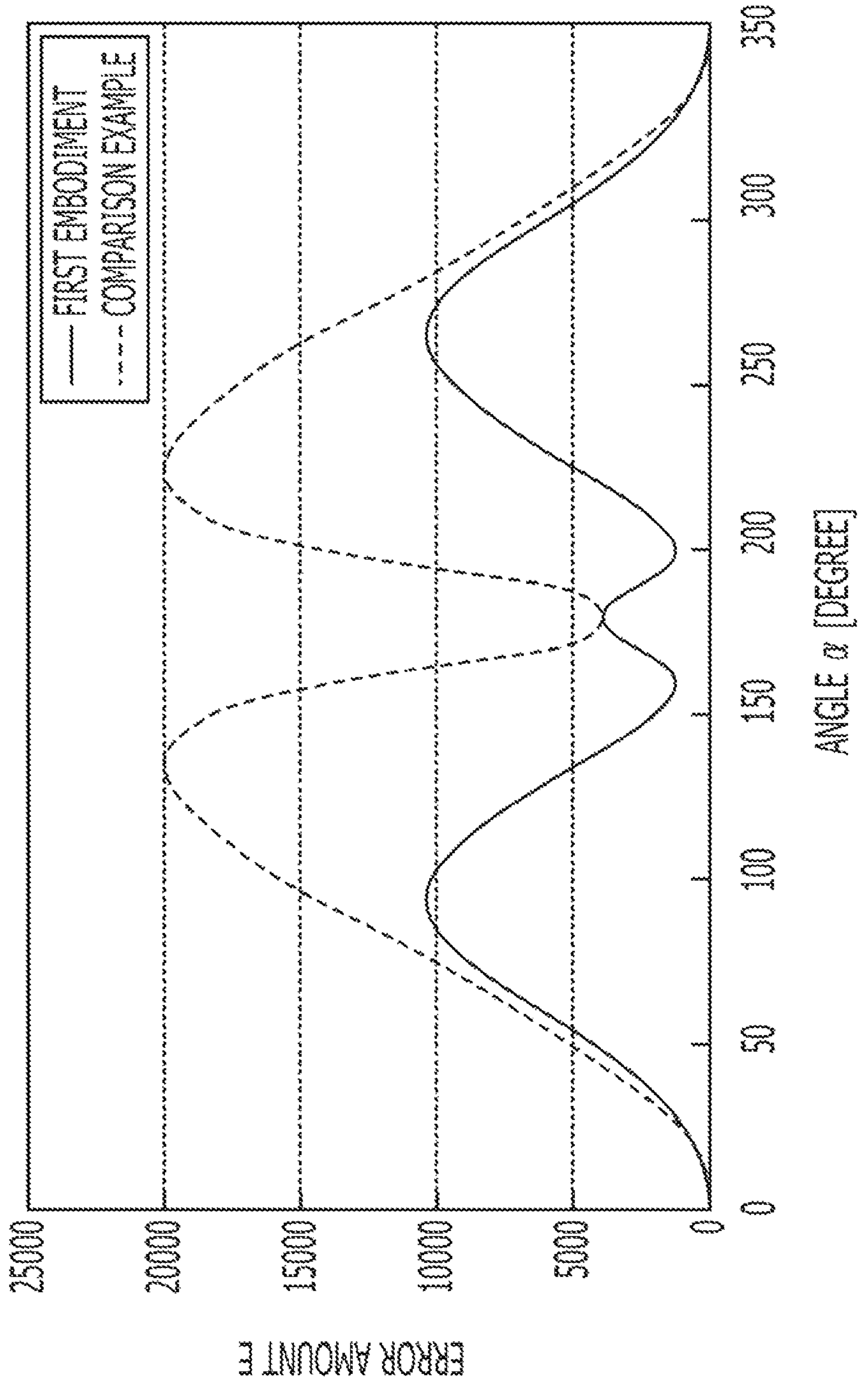
FIG. 3 is a characteristic chart illustrating a result of comparison between the first embodiment and a comparison example.

FIG. 3 is a characteristic chart illustrating a result of a comparison between the first embodiment and a comparison example. In FIG. 3, the vertical axis indicates an error amount E, while the horizontal axis indicates an angle "α." The angle "α" is an angle between a vector of the input signal $C_{in}$ and a vector of the $L_{in}$ ($R_{in}$) where the vectors of the input signal $L_{in}$ and $R_{in}$ are assumed to be substantially the same. The graph for the first embodiment indicates a simulation result of the error amount E when the rotation correction unit 2 applies a rotation correction to the $l_0'$ and $r_0'$ that are output by the matrix conversion unit 1. The graph for the comparison example indicates a simulation result of the error amount E when the rotation correction unit 2 does not apply a rotation correction to the $l_0$ and $r_0$ that are output by the matrix conversion unit 1. As may be obvious from FIG. 3, the error amount E of the first embodiment is smaller than that of the comparison example.

According to the first embodiment, when the vectors of the input signals $L_{in}$ and $R_{in}$ are substantially the same, downmix signals $l_0'$ and $r_0'$ and channel predictive parameters, $c_1$ and $c_2$ when an error amount E of an upmix signal for the input signal becomes substantially the minimum are obtained. The downmixing device outputs values obtained by encoding the downmix signals $l_0'$ and $r_0'$ and channel predictive parameters, $c_1$ and $c_2$ when the error amount E becomes substantially the minimum to the decoder side. Accordingly, the input signal to the downmixing device may be reproduced with high accuracy when decoded at the decoder side and upmixing processing is applied based on the downmix signals $l_0'$ and $r_0'$ and channel predictive parameters, $c_1$ and $c_2$. In other words, degradation of sound quality may be suppressed when sound in which the vectors of the input signals $L_{in}$ and $R_{in}$ that are input to the downmixing device are substantially the same is reproduced at the decoding side.

Second Embodiment

The second embodiment uses the downmixing device according to the first embodiment as an MPEG Surround (MPS) encoder. MPS decoder and MPS decoding technologies are specified in International Organization for Standardization (ISO)/International Electrotechnical Commission (IEC) 23003-1. The MPS encoder converts an input signal to a signal decodable by the specified MPS decoder. The downmixing device according to the first embodiment may be applied to other encoding technologies as well.

Description of the Downmixing Device

Figure 4:
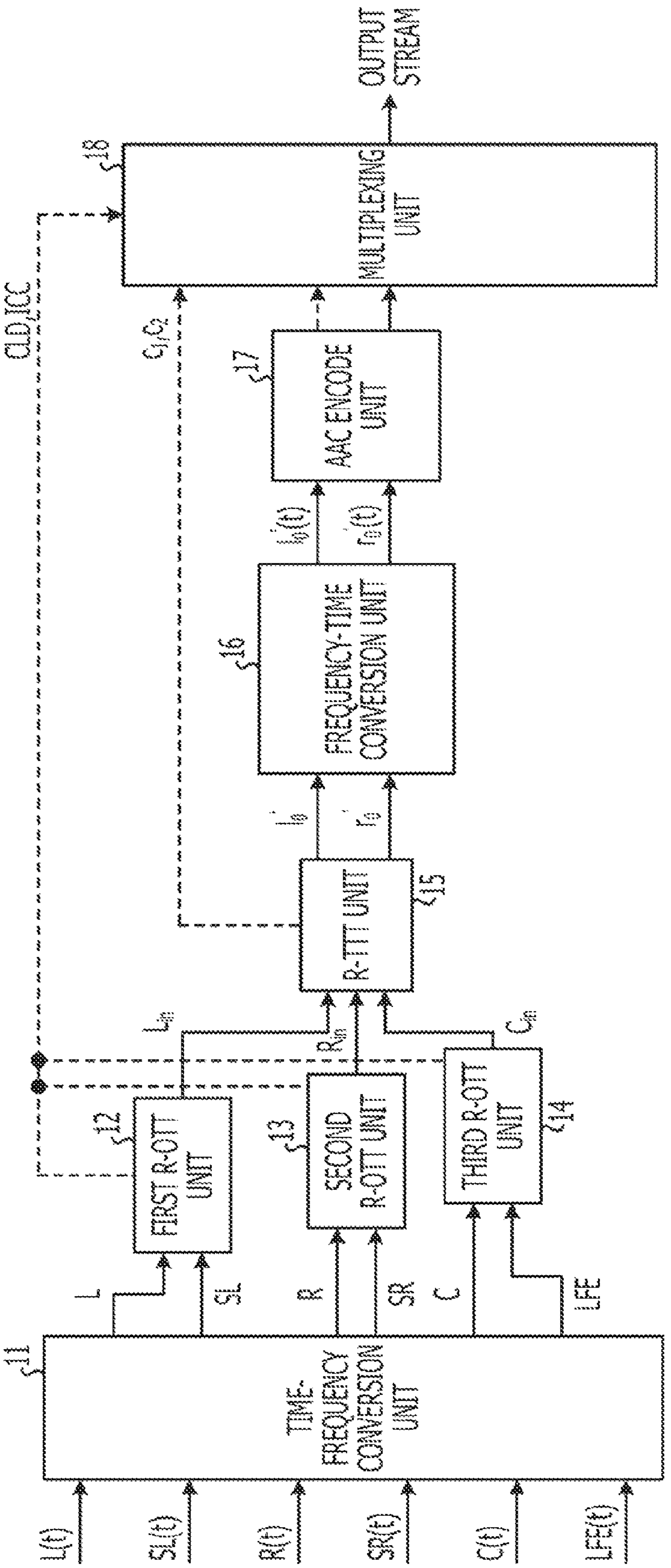
FIG. 4 is a block diagram illustrating a downmixing device according to a second embodiment.

FIG. 4 is a block diagram illustrating a downmixing device according to the second embodiment. As illustrated in FIG. 4, the downmixing device includes a time-frequency conversion unit 11, a first Reverse one to two (R-OTT) unit 12, a second R-OTT unit 13, a third R-OTT unit 14, a Reverse two to three (R-TTT) unit 15, a frequency-time conversion unit 16, an Advanced Audio Coding (AAC) unit 17, and a multiplexing unit 18. Functions of each of the components are achieved by executing an encoding process, for example, by a processor. In FIG. 4, a signal with "(t)" such as "L (t)" indicates that is a time domain signal.

The time-frequency conversion unit 11 converts time domain multi-channel signals that are input to the MPS encoder into frequency domain signals. In a 5.1 channel surround system, multi-channel signals are, for example, a left front signal L, a left side signal SL, a right front signal R, a right side signal SR, a center signal C, and a low-frequency band signal, Low Frequency Enhancement (LFE).

Figure 5:
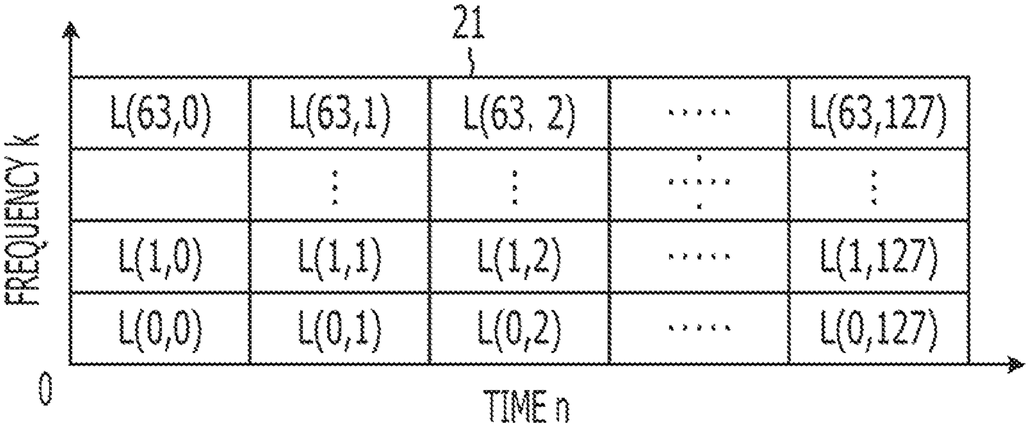
FIG. 5 illustrates a time-frequency conversion in the downmixing device according to the second embodiment.

For the time-frequency conversion unit 11, for example, a complex type Quadrature Mirror Filter (QMF) bank indicated in the expression 11 may be used. FIG. 5 illustrates frequency conversions of an L channel signal. A case is illustrated in which the number of samples for the frequency axis is 64, and the number of samples for the time axis is 128. In FIG. 5, L (k, n) 21 is a sample of a frequency band "k" at time "n." The same applies to signals of respective channels, the SL, R, SR, C and LFE.

Expression 11

$$QMF[k][n] = \exp\left[j\frac{\pi}{128}(k+0.5)(2n-1)\right],\quad 0 \le k < 64,\quad 0 \le n < 128 \tag{11}$$

The R-OTT units 12, 13, and 14 downmix two-channel signals into one-channel signal respectively. The first R-OTT unit 12 generates a downmix signal $L_{in}$ obtained by downmixing a frequency signal L of the L channel and a frequency signal SL of the SL channel. The first R-OTT unit 12 generates spatial information based on the frequency signal L of the L channel and the frequency signal SL of the SL channel. Spatial information to be generated is Channel Level Difference (CLD) that is a difference of levels between the downmixed two channels and an Inter-channel Coherence (ICC) that is an interrelation of the downmixed two channels. The second R-OTT unit 13 generates, in the same manner as the first R-OTT unit 12, a downmix signal $R_{in}$, and spatial information (CLD and ICC) for the frequency signal R of the R channel and a frequency signal SR of the SR channel. The third R-OTT unit 14 generates, in the same manner as the first R-OTT unit 12, a downmix signal $c_{in}$, and spatial information (CLD and ICC) for the frequency signal C of the C channel and a frequency signal LFE of the LFE channel.

Calculations by the first R-OTT unit 12, the second R-OTT unit 13, and the third R-OTT unit 14 will be collectively described. The first R-OTT unit 12, the second R-OTT unit 13, and the third R-OTT unit 14 may calculate a downmix signal M by the expression (12). The $x_1$ and $x_2$ in the expression (12), are signals of two channels to be downmixed. The first R-OTT unit 12, the second R-OTT unit 13, and the third R-OTT unit 14 may calculate a difference of levels between channels, CLD by the expression (13). The first R-OTT unit 12, the second R-OTT unit 13, and the third R-OTT unit 14 may calculate an Inter-channel Coherence (ICC) that is an interrelation of the channels by the expression (14).

Expression 12

$$M = x_1 + x_2 \tag{12}$$

Expression 13

$$CLD = 10\log 10\left(\frac{\sum_n\sum_k x_1^{n,k}x_1^{n,k*}}{\sum_n\sum_k x_2^{n,k}x_2^{n,k*}}\right) \tag{13}$$

-continued

Expression 14

$$ICC = \mathrm{Re}\left(\frac{\sum_n\sum_k x_1^{n,k}x_2^{n,k*}}{\sqrt{\sum_n\sum_k x_1^{n,k}x_1^{n,k*}\sum_n\sum_k x_2^{n,k}x_2^{n,k*}}}\right) \tag{14}$$

The R-TTT unit 15 downmixes three-channel signals into two-channel signals. The R-TTT unit 15 outputs the $l_0$' and $r_0$' and channel predictive parameters, $c_1$ and $c_2$ based on the downmix signals $L_{in}$, $R_{in}$, and $C_{in}$ that are output from the three R-OTT units 12, 13, and 14 respectively. The R-TTT unit 15 includes a downmixing device according to the first embodiment, for example, as illustrated in FIG. 1. The R-TTT unit 15 will not be described in detail because that is substantially the same as that described in the first embodiment.

The frequency-time conversion unit 16 converts the $l_0$' and $r_0$' that are output signals of the R-TTT unit 15 into time domain signals. For the frequency-time conversion unit 16, for example, a complex type Quadrature Mirror Filter (QMF) bank represented in the expression (15) may be used.

Expression 15

$$IQMF[k][n] = \frac{1}{64}\exp\left(j\frac{\pi}{64}\left(k+\frac{1}{2}\right)(2n-127)\right),\quad 0 \le k < 32,\quad 0 \le n < 32 \tag{15}$$

The AAC encode unit 17 generates AAC data and an AAC parameter by encoding the $l_0$' and $r_0$' that are converted into time domain signals. For an encoding technology of the AAC encode unit 17, for example, a technology discussed in the Japanese Laid-open Patent Publication No. 2007-183528 may be used.

Figure 6:
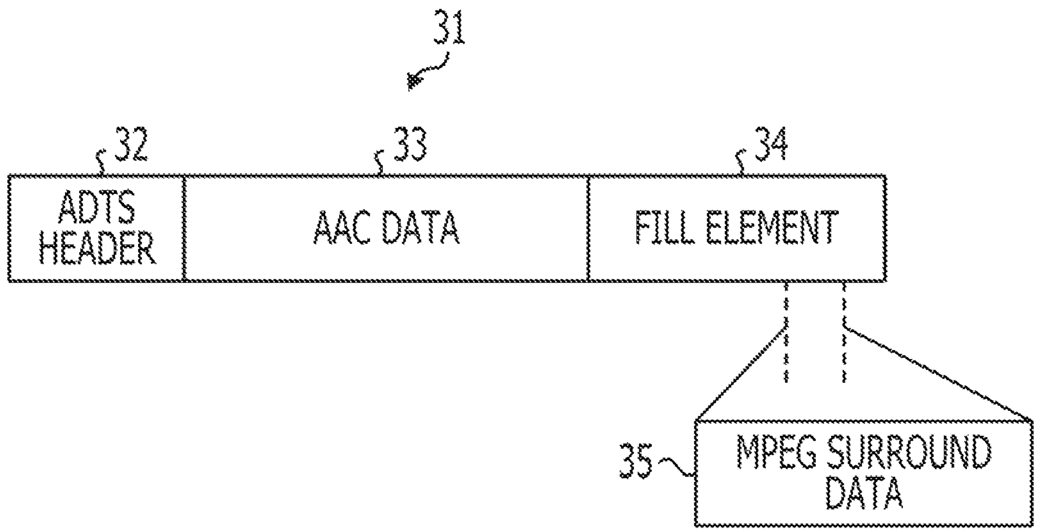
FIG. 6 is an example of MPEG-2 ADTS format.

The multiplexing unit 18 generates output data obtained by multiplexing the CLD that is a difference of levels between channels, the ICC that is a correlation between channels, the channel predictive parameter $c_1$, the channel predictive parameter $c_2$, the AAC data and the AAC parameter. For example, an MPEG-2 Audio Data Transport Stream (ADTS) format may be considered as an output data format. FIG. 6 illustrates an example of the MPEG-2 ADTS format. Data 31 with the ADTS format includes an ADTS header field 32, an AAC data field 33, and a fill element field 34. The fill element field 34 includes an MPEG surround data field 35. AAC data generated by the AAC encode unit 17 is stored in the AAC data field 33. Spatial information (CLD, ICC, $c_1$ and $c_2$) is stored in the MPEG surround data field 35.

Description of the Downmixing Method

Figure 7:
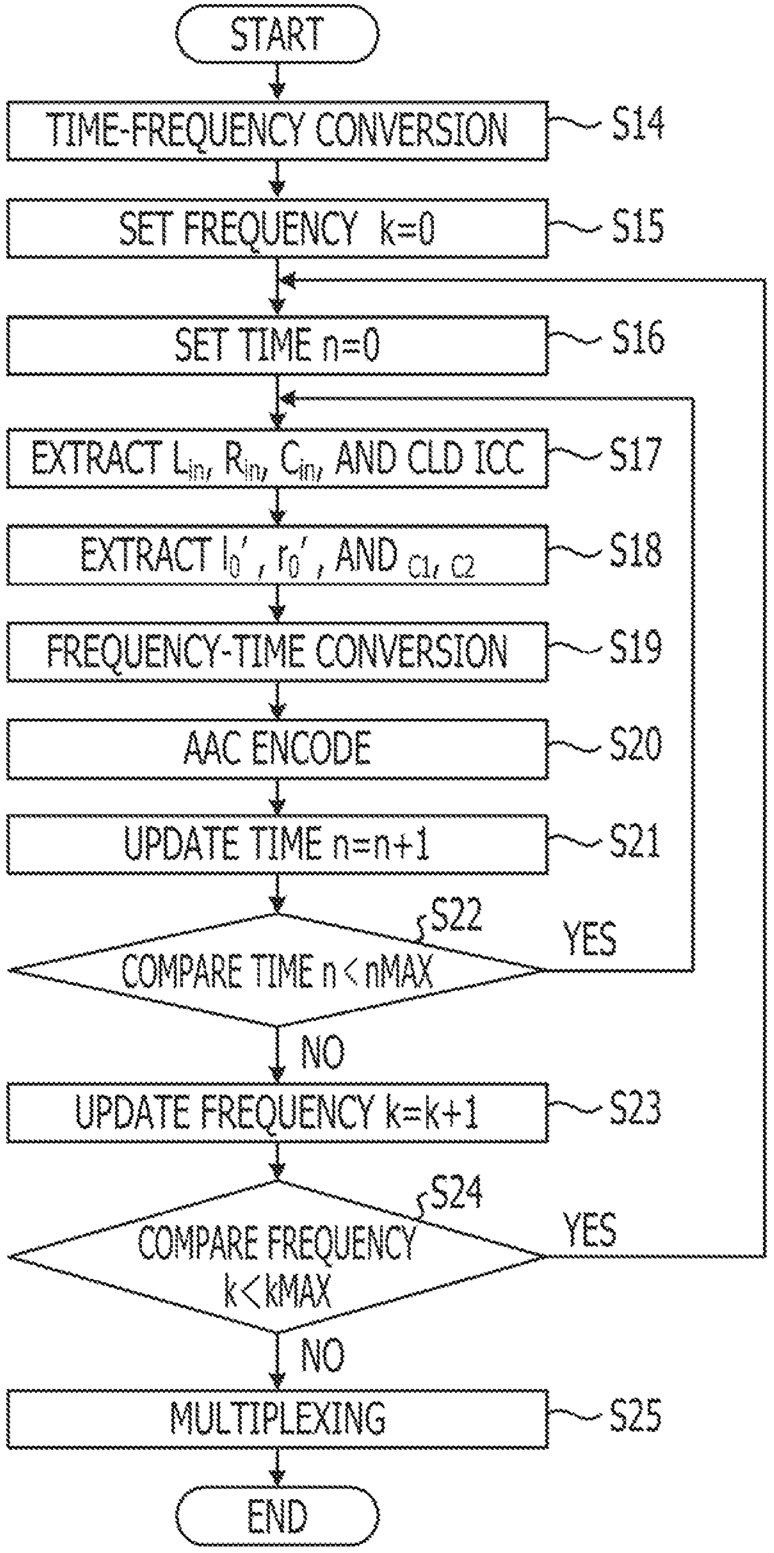
FIG. 7 is a flow chart illustrating a downmixing method according to the second embodiment.

FIG. 7 is a flow chart illustrating a downmixing method according to the second embodiment. As illustrated in FIG. 7, when downmixing processing starts, the time-frequency conversion unit 11 converts time domain multi-channel signals that are input to the MPS encoder into frequency domain signals (Operation S14). Operations S15 to S24 described below will be executed for each of the sample L (k, n) of the frequency band k at time n.

For a frequency band k at time n, 0 is set (Operation S15). For time n, 0 is set (Operation S16). In other words, processing is executed for multi-channel signals of frequency band 0 at time 0. The first R-OTT unit 12, the second R-OTT unit 13, and the third R-OTT unit 14 calculate downmix signals $L_{in}$, $R_{in}$ and $C_{in}$ for each channel signal of the frequency band 0.

Moreover, the first R-OTT unit 12, the second R-OTT unit 13, and the third R-OTT unit 14 calculate the CLD that is a difference of levels between channels and the ICC that is a correlation between channels (Operation S17).

The R-TTT unit 15 calculates $l_0$' and $r_0$' after applying a rotation correction from the $L_{in}$, $R_{in}$ and $C_{in}$. Moreover, the R-TTT unit 15 calculates channel predictive parameters, $c_1$ and $c_2$ (Operation S18). The processing procedure at Operation S18 will not be described in detail because it is substantially the same as, for example, the downmixing method according to the first embodiment illustrated in FIG. 2.

The frequency-time conversion unit 16 converts $l_0$' and $r_0$' into time domain signal (Operation S19). The AAC encode unit 17 encodes (AAC encode) the $l_0$' and $r_0$' that are converted into the time domain signal by applying an AAC encoding technology to generate AAC data and an AAC parameter (Operation S20).

The time n is incremented for +1 and updated (Operation S21). The updated time n is compared with a substantially maximum value $n_{max}$ (Operation S22). When the time n is smaller than the substantially maximum value $n_{max}$ (Operation S22: Yes), Operations S17 to S21 are repeated. When the time n is not smaller than the substantially maximum value $n_{max}$ (Operation S22: No), Operations S17 to S21 are not repeated.

The frequency k is incremented for +1 and updated (Operation S23). The updated frequency k is compared with a substantially maximum value $k_{max}$ (Operation S24). When the frequency k is smaller than the substantially maximum value $k_{max}$ (Operation S24: Yes), Operations S16 to S23 are repeated. When the frequency k is not smaller than the substantially maximum value $k_{max}$ (Operation S24: No), Operations S16 to S23 are not repeated. When the AAC encoding at Operation S20 for all combinations of samples for time n and frequency band k are completed, the multiplexing unit 18 multiplexes the CLD, ICC, $c_1$, $c_2$, AAC data and AAC parameter (Operation S25). The series of downmixing processing is completed.

According to the second embodiment, the downmixing device that is substantially the same as that of the first embodiment is provided. Thus, substantially the same effect as that of the first embodiment is achieved for the MPS encoder.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

The invention claimed is:

1. A downmixing device comprising:

a memory; and a processor, the processor configured to execute instructions stored in the memory, the instructions including:

an input receiving instruction configured to receive an input signal including a plurality of channels;

a matrix conversion instruction configured to perform a matrix operation for the input signal using a matrix D and output a plurality of signals applied with the matrix operation;

a rotation correction instruction configured to provide different phase rotations with each of at least two signals of the plurality of signals outputted the matrix conversion instruction based on vectors of the plurality of channels when each of phases of the at least two signals is the same;

a spatial information extraction instruction configured to extract spatial information from output signals of the rotation correction instruction;

an inverse matrix conversion instruction configured to perform an inverse matrix operation for the output signals of the rotation correction instruction and for a signal generated based on the spatial information using an inverse matrix $D^{-1}$, which is an inverse of the matrix D used for the matrix operation by the matrix conversion instruction; and an error calculation instruction configured to calculate an error amount between the input signal and a result of the inverse matrix conversion instruction, wherein:

the rotation correction instruction determines the different phase rotations based on the error amount; and the spatial information extraction instruction determines final spatial information based on the error amount.

2. The downmixing device according to claim 1, wherein the spatial information extraction instruction calculates, as the spatial information, a coefficient for each vector when a signal to be predicted among output signals of the matrix conversion instruction is decomposed into vectors of the output signals of the rotation correction instruction.

3. The downmixing device according to claim 1, wherein the rotation correction instruction compares the error amount calculated by the error calculation instruction while changing the different phase rotations for the plurality of signals outputted by the matrix conversion instruction to determine a phase rotation-result when the error amount becomes substantially the minimum as a final output signal.

4. The downmixing device according to claim 1, wherein the spatial information extraction instruction determines spatial information that corresponds to a phase rotation when an error amount calculated by the error amount calculation instruction becomes substantially the minimum as final spatial information.

5. The downmixing device according to claim 1, wherein the rotation correction instruction determines a phase rotation when an error amount calculated by the error calculation instruction becomes substantially the minimum for each frequency band of the input signal; and the spatial information extraction instruction determines spatial information that corresponds to a phase rotation when an error amount calculated by the error calculation instruction becomes substantially the minimum for each frequency band of the input signal.

6. A downmixing method comprising:

input receiving to receive an input signal including a plurality of channels;

matrix converting to perform a matrix operation for the input signal using a matrix D and output a plurality of signals applied with the matrix operation;

rotation correcting to provide different phase rotations with each of at least two signals of the plurality of signals outputted by the matrix converting based on vectors of the plurality of channels when each of phases of the at least two signals is the same;

spatial information extracting to extract spatial information from output signals of the rotation correcting;

inverse matrix converting to perform an inverse matrix operation for the output signals of the rotation correcting and for a signal generated based on the spatial information using an inverse matrix $D^{-1}$, which is an inverse of the matrix D used for the matrix converting;

error calculating to calculate, by a computer processor, an error amount between the input signal and a result of the inverse matrix operation;

comparing a new error amount obtained by the error calculating with an error amount in the past;

updating the phase rotation and spatial information in the past to a new phase rotation and spatial information extracted at the spatial information extracting that correspond to the new error amount when the new error amount obtained at the comparing errors is less than the error amount in the past; and repeating the rotation correcting, the spatial information extracting, the inverse matrix converting, the error calculating, the comparing errors and the updating while changing the different phase rotations for the plurality of signals outputted by the matrix converting.

7. The downmixing method according to claim 6, wherein the spatial information extracting calculates, as the spatial information, a coefficient for each vector when a signal to be predicted among output signals of the matrix converting is decomposed into vectors of the output signals of the rotation correcting.

8. The downmixing method according to claim 6, wherein the rotation correcting determines a phase rotation when the error amount calculated at the error calculating becomes substantially the minimum for each frequency band of the input signal, and the spatial information extracting determines spatial information that corresponds to a phase rotation when an error amount calculated by the error calculating becomes substantially the minimum for each frequency band of the input signal.

9. The downmixing device according to claim 1, wherein the rotation correction instruction is configured to provide different phase rotations with each of at least two signals of the plurality of signals outputted by the matrix conversion instruction when the vectors of the plurality of channels are the same.

* * * * *